(12) United States Patent
Senda et al.

(10) Patent No.: US 8,223,239 B2
(45) Date of Patent: Jul. 17, 2012

(54) CLOCK SIGNAL GENERATION CIRCUIT, DISPLAY PANEL MODULE, IMAGE SENSOR APPARATUS, AND ELECTRONIC APPARATUS

(75) Inventors: Michiru Senda, Kanagawa (JP); Hiroshi Mizuhashi, Kanagawa (JP); Gen Koide, Kanagawa (JP)

(73) Assignee: Sony Corporation, Tokyo (JP)

( * ) Notice: Subject to any disclaimer, the term of this patent is extended or adjusted under 35 U.S.C. 154(b) by 950 days.

(21) Appl. No.: 12/248,992

(22) Filed: Oct. 10, 2008

(65) Prior Publication Data
US 2009/0096906 A1  Apr. 16, 2009

(30) Foreign Application Priority Data

Oct. 16, 2007  (JP) .................. 2007-268663

(51) Int. Cl.
  *H04N 5/335*  (2006.01)
(52) U.S. Cl. ........................................ 348/312
(58) Field of Classification Search .................. 348/312, 348/249, 250, 282, 292, 377
See application file for complete search history.

(56) References Cited

U.S. PATENT DOCUMENTS 5,457,494 A *  10/1995  Suga et al. ................. 348/229.1
7,019,573 B2 *  3/2006  Matsuno ....................... 327/161
7,250,941 B2 *  7/2007  Kida et al. ................... 345/204
7,342,985 B1 *  3/2008  Stene ........................... 375/376

FOREIGN PATENT DOCUMENTS

| JP | 2002-100982 A | 4/2002 |
|----|---------------|--------|
| JP | 2004-050650 A | 2/2004 |
| JP | 2005-020711 A | 1/2005 |
| JP | 2005-074580 A | 3/2005 |
| JP | 2006-287641   | 10/2006 |
| JP | 2007-006517   | 1/2007 |
| JP | 2005-038557 A | 10/2009 |

OTHER PUBLICATIONS

Japanese Patent Office, Office Action issued in Patent Application JP2007-268663, on Aug. 19, 2009.

* cited by examiner

*Primary Examiner* — Ricky Mack
*Assistant Examiner* — Vipin Patel
(74) *Attorney, Agent, or Firm* — SNR Denton US LLP

(57) ABSTRACT

A clock signal generation circuit of a delay locked loop type includes a delay line configured to delay a first clock signal to generate a second clock signal; a delay amount controller configured to change the amount of delay in the delay line in such a manner that a phase of the second clock signal is in synchronization with a phase of the first clock signal; a pseudo-lock detection section configured to detect a pseudo-locked state of the first clock signal and the second clock signal; and a pseudo-locked state release section configured to change the amount of delay in the delay line in a case that the pseudo-locked state is detected.

8 Claims, 20 Drawing Sheets

FIG. 9

| CLK1 | CLK2 | Q1 | Q2 | wng |
|------|------|----|----|-----|
| L | L | L | L | L |
| L | L | L | H | L |
| L | L | H | L | L |
| L | H | L | L | H |
| L | H | L | H | L |
| L | H | H | L | L |
| H | L | L | L | H |
| H | L | L | H | L |
| H | L | H | L | L |
| H | H | L | L | L |
| H | H | L | H | L |
| H | H | H | L | L |

CLOCK SIGNAL GENERATION CIRCUIT, DISPLAY PANEL MODULE, IMAGE SENSOR APPARATUS, AND ELECTRONIC APPARATUS

CROSS REFERENCES TO RELATED APPLICATIONS

The present invention contains subject matter related to Japanese Patent Application JP 2007-268663 filed in the Japanese Patent Office on Oct. 16, 2007, the entire contents of which are incorporated herein by reference.

BACKGROUND OF THE INVENTION

1. Field of the Invention

The present invention relates to a clock signal generation circuit of a delay locked loop type, and more particular, to a clock signal generation circuit of a delay locked loop type in which active elements are formed by using a thin-film deposition technique or a printing technique. The present invention also relates to a display panel module, an image sensor apparatus, and an electronic apparatus.

2. Description of the Related Art

Recently, a higher display resolution has been desired not only for large-sized displays but also for medium- or small-sized displays. Under such circumstances, frequencies of input clock signals and image signals have become higher.

For example, a system display in which functional circuits are provided on a display substrate in a concentrated manner converts serial image signals into parallel image signals so that signal frequencies can be lowered. Thus, the operating margins can be improved.

However, problems regarding circuit delay and operating margins still exist in a circuit portion where parallel conversion of image signals has not yet been performed. In particular, in the case of recent system displays for which the input frequency of an image signal is very high, a delay difference occurring between a clock signal and the image signal on the display substrate causes sampling failure.

Clock signal generation circuits of a delay locked loop type described, for example, in Japanese Unexamined Patent Application Publication Nos. 2006-287641 and 2007-6517 are available.

SUMMARY OF THE INVENTION

However, compared with transistors formed on silicon wafers, thin-film transistors formed on display substrates or any other insulating substrates have large variations in characteristics thereof. Thus, for a clock signal generation circuit including thin-film transistors formed on an insulating substrate, countermeasures against a state where the phase difference between clock signals is 180 degrees (that is, a pseudo-locked state), as shown in FIG. 1, are necessary.

According to an embodiment of the present invention, there is provided a clock signal generation circuit of a delay locked loop type including a delay line configured to delay a first clock signal to generate a second clock signal; a delay amount controller configured to change the amount of delay in the delay line in such a manner that a phase of the second clock signal is in synchronization with a phase of the first clock signal; a pseudo-lock detection section configured to detect a pseudo-locked state of the first clock signal and the second clock signal; and a pseudo-locked state release section configured to change the amount of delay in the delay line in a case that the pseudo-locked state is detected.

It is desirable that, in a case that the pseudo-locked state is detected, the pseudo-locked state release section of the clock signal generation circuit release the pseudo-locked state by inverting a clock phase in the delay line. In this case, by a single inversion operation, the phase state can be approximated to substantially the locked state.

In addition, it is desirable that, in a case that the pseudo-locked state is detected, the pseudo-locked state release section of the clock signal generation circuit release the pseudo-locked state by shifting a clock phase in the delay line by an amount corresponding to a set value. In this case, although the phase state is not approximated to the locked state by a single inversion operation, at least the pseudo-locked state can be avoided and a phase adjustment operation can be achieved by a normal operation.

In addition, an advantage can be particularly expected to be achieved in a case where the delay line, the delay amount controller, the pseudo-lock detection section, and the pseudo-locked state release section are formed on an insulating substrate by using one of a thin-film deposition technique and a printing technique. The clock signal generation circuit can be used in a display panel module including a driving circuit configured to drive a display panel in accordance with a clock signal.

In addition, the clock signal generation circuit can be used in an image sensor apparatus including a driving circuit configured to drive an image sensor device in accordance with a clock signal. In addition, the clock signal generation circuit can be used in an electronic apparatus including a system controller configured to control an operation of the entire system and an instruction reception section configured to receive an instruction for the system controller.

In the case of a clock signal generation circuit according to an embodiment of the present invention, when a pseudo-locked state is detected, the pseudo-locked state is forcibly released, and changing of the amount of delay based on a normal phase difference is performed.

BRIEF DESCRIPTION OF THE DRAWINGS

FIG. 9 is an illustration for explaining an internal operation of pseudo-lock;

DESCRIPTION OF THE PREFERRED EMBODIMENTS

A case where an embodiment of the present invention is applied to a system display will be described. Technologies of the related art in the field of the present invention are applied to portions that are not particularly illustrated or described in this specification. In addition, embodiments described below are merely exemplary embodiments. The present invention is not limited to any of the embodiments described below.

First Embodiment

Figure 2:
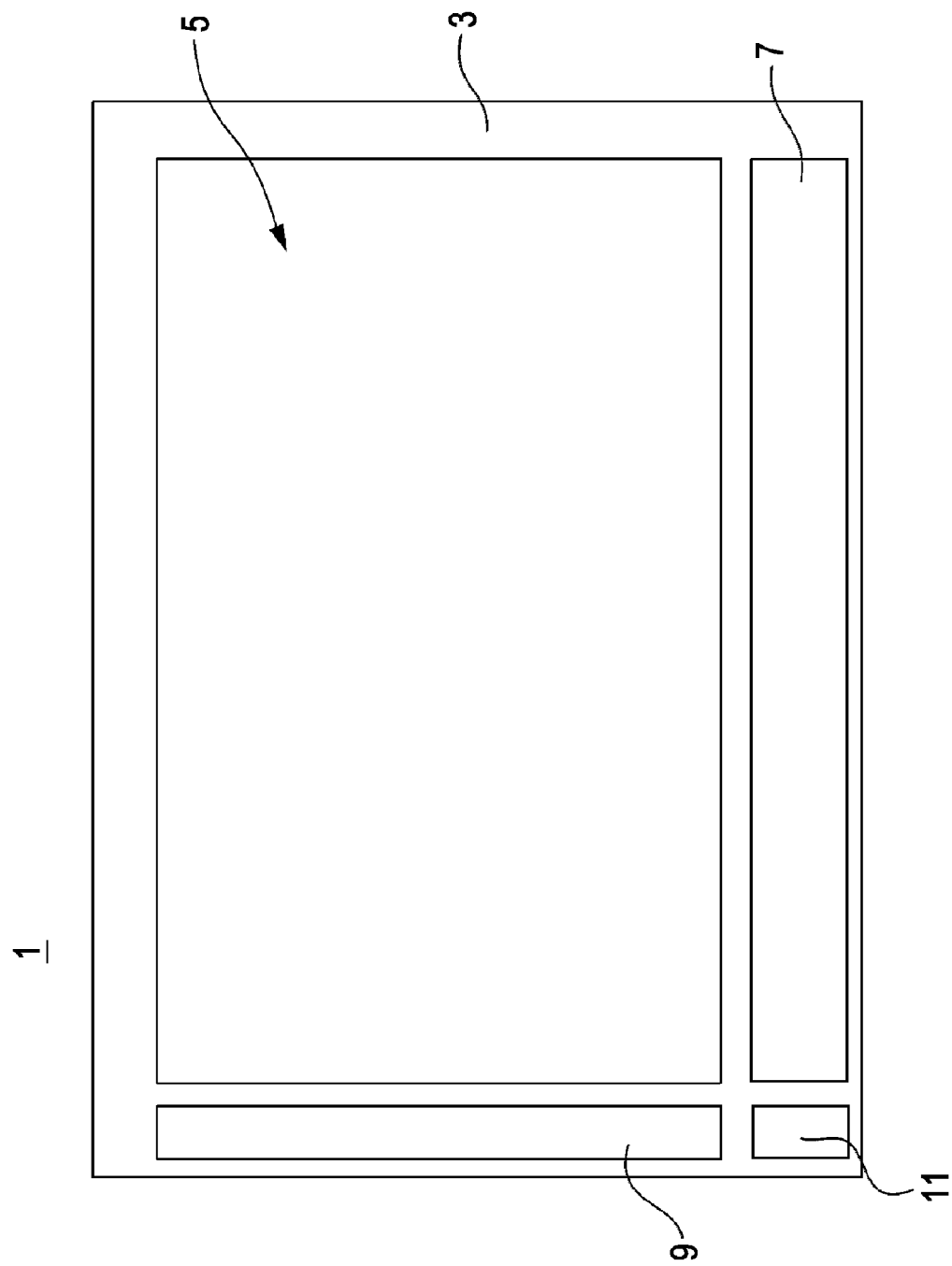
FIG. 2 shows an example of the planar configuration of a display panel.

FIG. 2 shows an example of the planar configuration of a display panel 1 according to a first embodiment. In this embodiment, a display area 5 and functional circuits are formed on a surface of a glass substrate 3 in the same process. Pixel circuits configured to change the brightness levels of corresponding pixels; N pixel control lines for supplying driving signals to the pixel circuits; and M image signal lines are formed in the display area 5.

A signal line driver 7, a scanning line driver 9, a clock signal generation circuit 11, and the like are formed as the functional circuits. The signal line driver 7 and the scanning line driver 9 operate in accordance with clocks generated by the clock signal generation circuit 11. The clock signal generation circuit 11 is a circuit configured to generate an output clock that is in synchronization with an input clock supplied from an external device.

Figure 3:
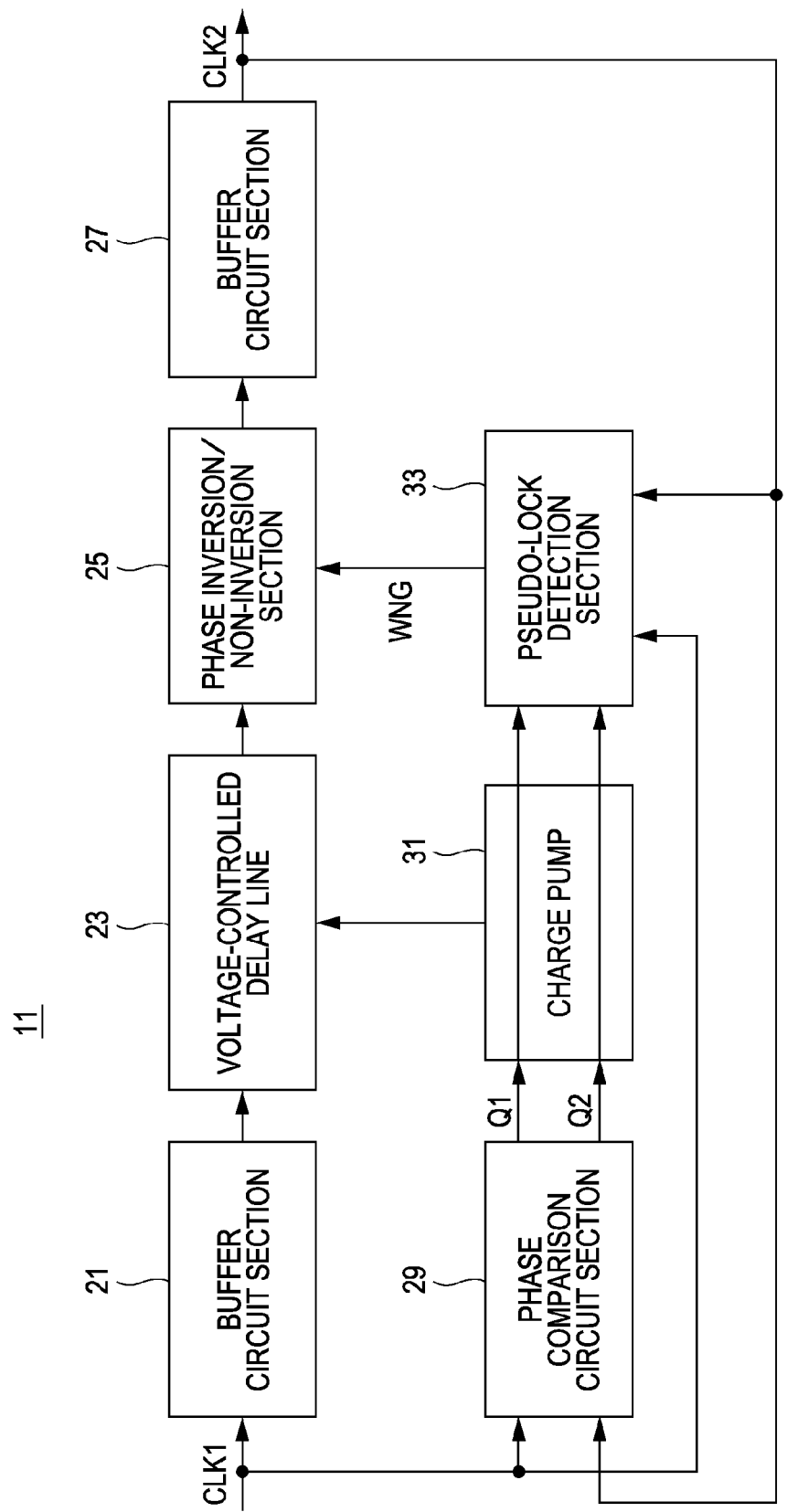
FIG. 3 shows an example of the configuration of a clock signal generation circuit.

FIG. 3 shows an example of the internal configuration of the clock signal generation circuit 11 according to an embodiment of the present invention. The clock signal generation circuit 11 shown in FIG. 3 is of an analog type. The clock signal generation circuit 11 includes a buffer circuit section 21, a voltage-controlled delay line 23, a phase inversion/non-inversion section 25, a buffer circuit section 27, a phase comparison circuit section 29, a charge pump 31, and a pseudo-lock detection section 33.

Each of the buffer circuit sections 21 and 27 includes a plurality of inverter circuits connected in series with each other. The buffer circuit section 21 serves as an input buffer and receives an input clock CLK1, which corresponds to a first clock signal according to an embodiment of the present invention. The buffer circuit section 27 serves as an output buffer and outputs an output clock CLK2, which corresponds to a second clock signal according to an embodiment of the present invention.

Figure 4:
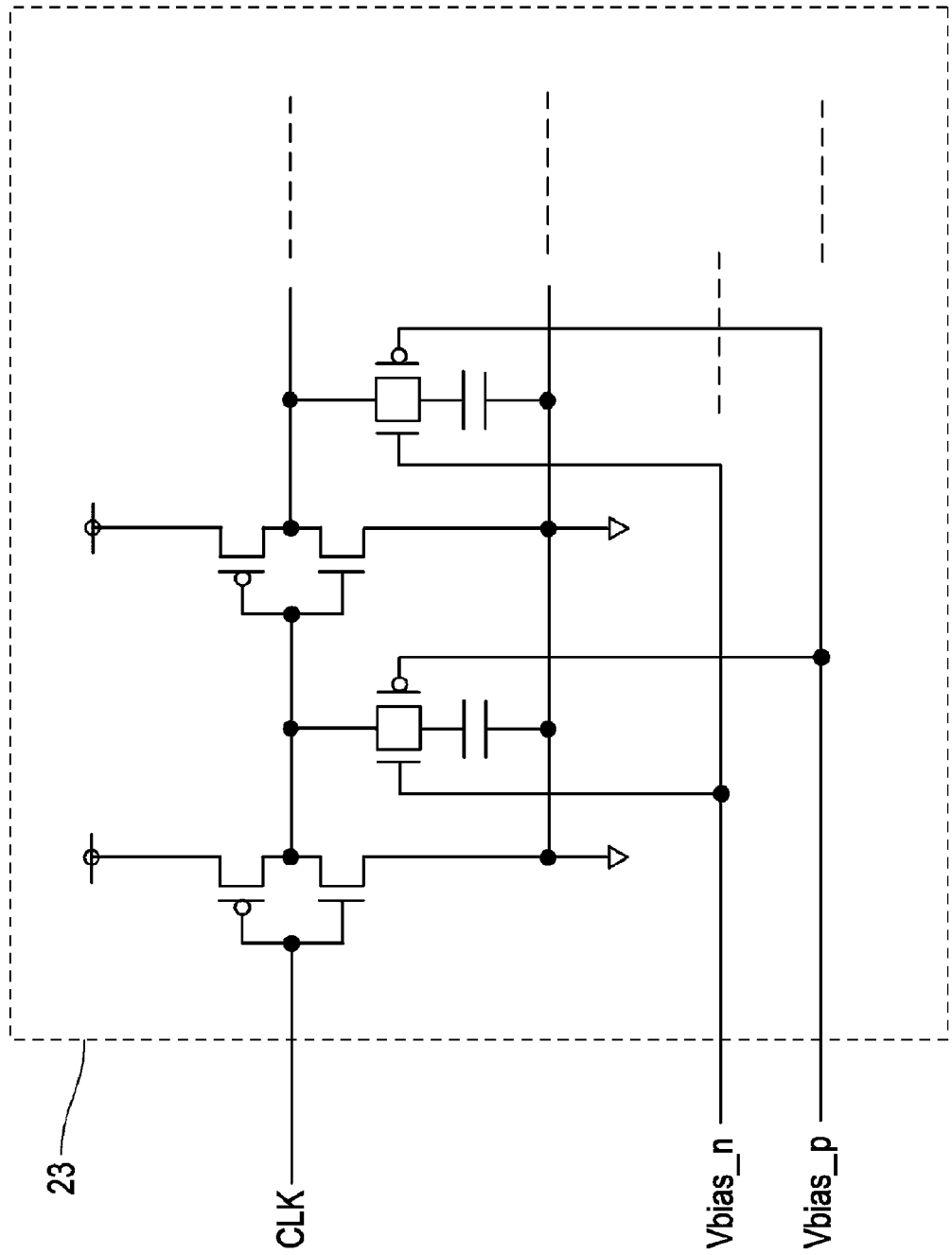
FIG. 4 shows an example of the configuration of a voltage-controlled delay line.

The voltage-controlled delay line 23 is a delay circuit section configured to adjust the phase of the input clock CLK1 in an analog fashion. FIG. 4 shows an example of the configuration of the voltage-controlled delay line 23. The voltage-controlled delay line 23 includes a plurality of inverter circuits connected to each other. The plurality of inverter circuits are each provided with a load capacitor.

With this circuit configuration, a delay time is controlled by changing the bias voltage Vbias of a pair of transistors connected between an output stage of an inverter circuit and a load capacitor. For example, in the case of an N-channel transistor, a low bias voltage Vbias_n (that is, an open state of a thin-film transistor) minimizes the amount of delay. For example, in the case of an N-channel transistor, a high bias voltage Vbias_n (that is, a close state of a thin-film transistor) maximizes the amount of delay.

For example, as the current drive capability is increased, the speed of carriers being charged or discharged to or from a load capacitor is increased. That is, the propagation speed of the voltage-controlled delay line 23 is increased, and the clock phase is advanced. On the other hand, as the current drive capability is reduced, the speed of carriers being charged or discharged to or from a load capacitor is reduced. That is, the propagation speed of the voltage-controlled delay line 23 is reduced, and the clock phase is delayed.

The phase inversion/non-inversion section 25 is a circuit section configured to invert the phase of a clock signal received from the voltage-controlled delay line 23 and output the inverted clock signal or to directly output the clock signal received from the voltage-controlled delay line 23 without inverting the clock signal. In this embodiment, the phase inversion/non-inversion section 25 is located between the voltage-controlled delay line 23 and the buffer circuit section 27. That is, the phase inversion/non-inversion section 25 is located on a delay line.

Figure 1:
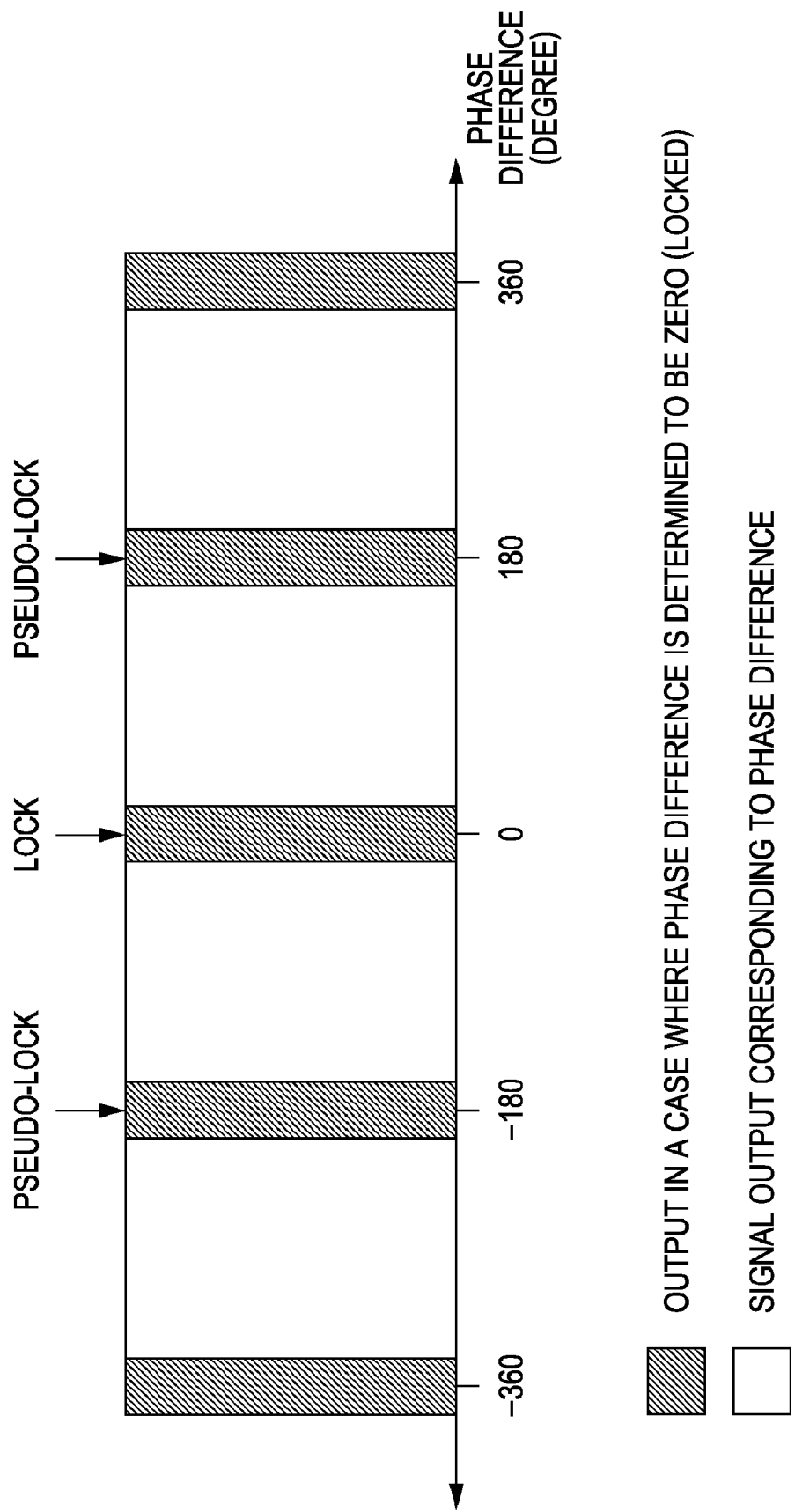
FIG. 1 is an illustration for explaining a phase locked state and a pseudo-locked state.

The phase inversion/non-inversion section 25 corresponds to a "pseudo-locked state release section" according to an embodiment of the present invention. In a pseudo-locked state, there is a phase difference of 180 degrees between the input clock CLK1 and the output clock CLK2, as shown in FIG. 1.

In the case that the pseudo-locked state is detected, the phase inversion/non-inversion section 25 inverts the phase of an input clock. In the case that the pseudo-locked state is not detected, the phase inversion/non-inversion section 25 directly outputs the input clock without performing inversion.

Figure 5:
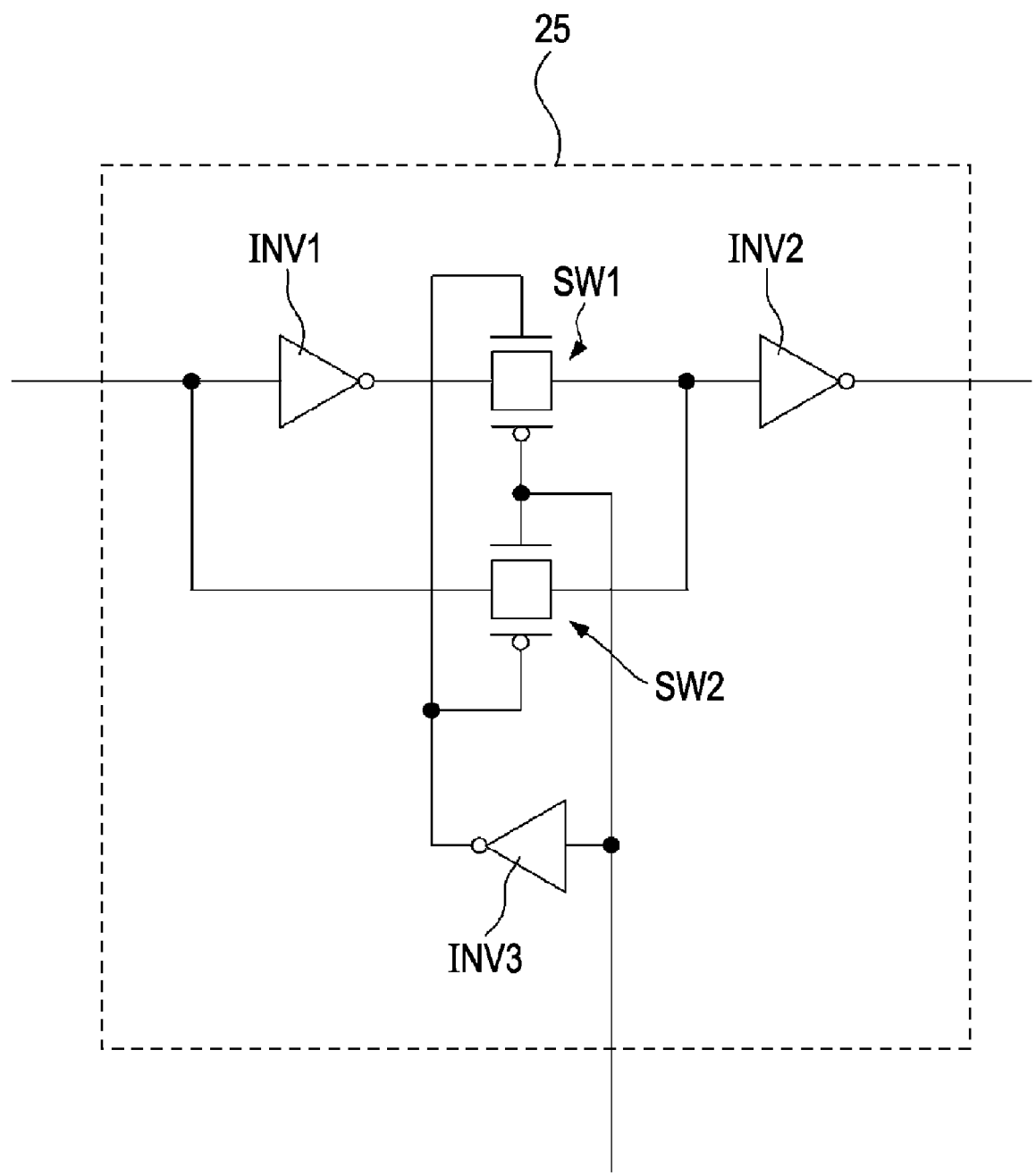
FIG. 5 shows an example of the configuration of a phase inversion/non-inversion section.

The phase inversion/non-inversion section 25 performs switching between inversion and non-inversion in accordance with a control signal supplied from the pseudo-lock detection section 33. FIG. 5 shows a circuit example of the phase inversion/non-inversion section 25.

The phase inversion/non-inversion section 25 shown in FIG. 5 includes a transmission channel in which two inverters INV1 and INV2 are provided and a transmission channel in which an inverter INV3 is provided. The phase inversion/non-inversion section 25 also includes a switch SW1 provided in the transmission channel in which the two inverters INV1 and INV2 are provided and a switch SW2 provided in the transmission channel in which the inverter INV3 is provided, so that a clock signal can pass through one of the transmission channel in which the two inverters INV1 and INV2 are provided and the transmission channel in which the inverter INV3 is provided.

The switches SW1 and SW2 operate in opposite ways. Thus, the phase inversion/non-inversion section 25 shown in FIG. 5 inverts connection of a switching signal. The inverter INV3 is used to open or close an N-channel thin-film transistor and a P-channel thin-film transistor at the same time, which form the switches SW1 and SW2.

The phase comparison circuit section 29 is a circuit section configured to compare the edge phase of the input clock CLK1 with the edge phase of the output clock CLK2 and output an up signal or a down signal to the charge pump 31. The charge pump 31 is configured to generate a bias voltage Vbias in accordance with a result of the comparison.

Figure 6:
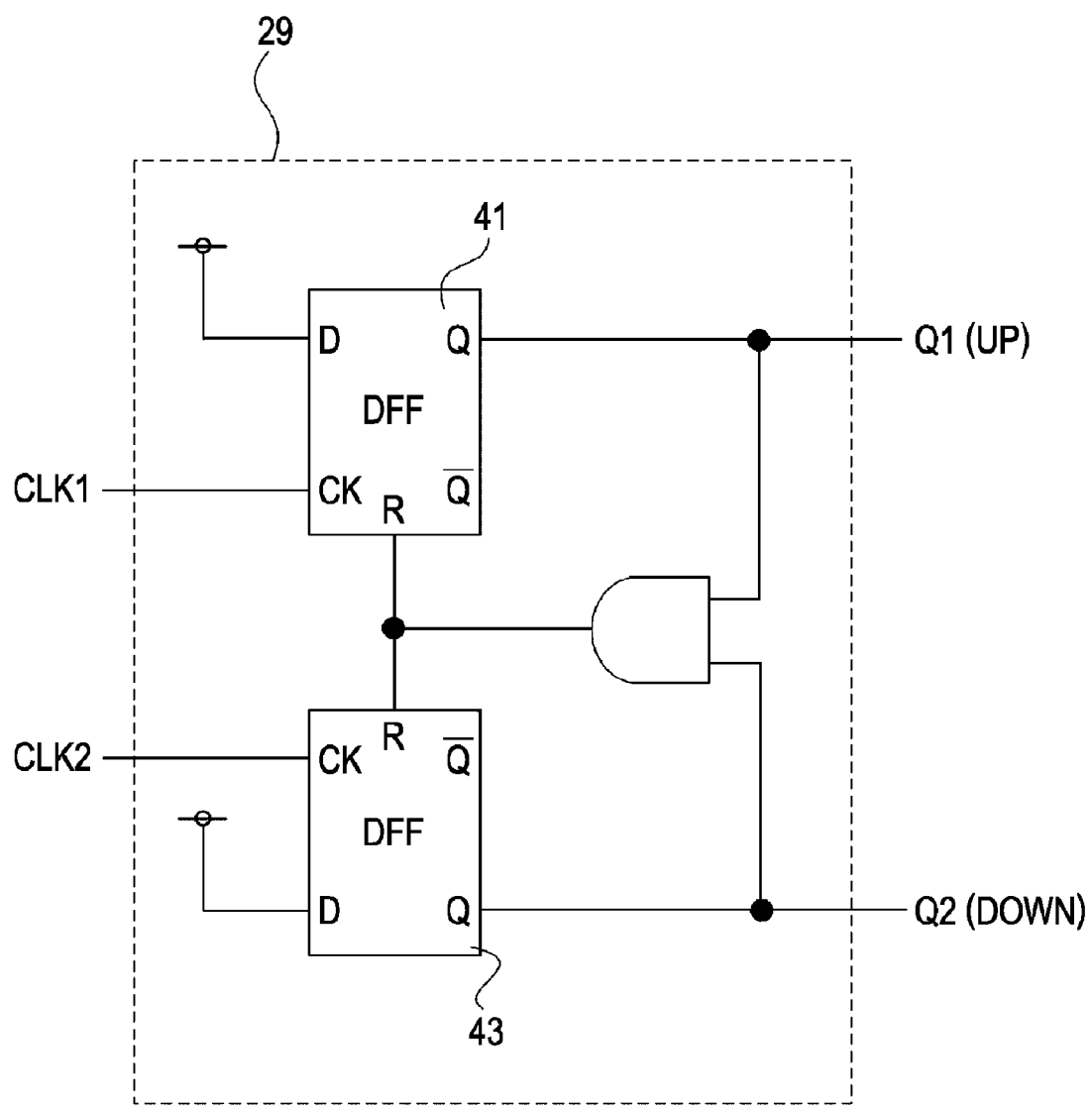
FIG. 6 shows an example of the configuration of a phase comparison circuit section.

FIG. 6 shows an example of the configuration of the phase comparison circuit section 29. The phase comparison circuit section 29 includes a D flip-flop 41 employing an input clock CLK1 as a clock signal, a D flip-flop 43 employing an output clock CLK2 as a clock signal, and an AND gate configured to perform a logical AND between output signals of the D flip-flops 41 and 43 and generate reset signals for the D flip-flops 41 and 43.

With this circuit configuration, an output signal of a D flip-flop corresponding to a clock CLK that exhibits level H earlier reaches level H earlier, and output signals Q1 and Q2 of the D flip-flops 41 and 43 are reset at the same point in time when an output signal of a D flip-flop corresponding to a clock CLK that exhibits level H later reaches level H.

Consequently, an up signal or a down signal is output so as to correspond to a phase difference. For example, in a case where the phase of the input clock CLK1 is advanced with respect to the phase of the output clock CLK2, an output signal Q1 corresponding to an up signal exhibits level H for a period corresponding to the phase difference. On the other hand, in a case where the phase of the output clock CLK2 is advanced with respect to the phase of the input clock CLK1, an output signal Q2 corresponding to a down signal exhibits level H for a period corresponding to the phase difference.

In a case where the edge phase of the input clock CLK1 is substantially the same as the edge phase of the output clock CLK2, the phase comparison circuit section 29 causes the D flip-flops 41 and 43 to output signals Q1 and Q2 at level L.

The case where the edge phase of the input clock CLK1 is substantially the same as the edge phase of the output clock CLK2 includes a case where the phase difference between the input clock CLK1 and the output clock CLK2 is 0 degree and a case where the phase difference between the input clock CLK1 and the output clock CLK2 is 180 degrees. Thus, in a case where a determination is performed only in accordance with the output signals Q1 and Q2 of the phase comparison circuit section 29, a pseudo-locked state may be falsely determined to be a locked state.

Figure 7:
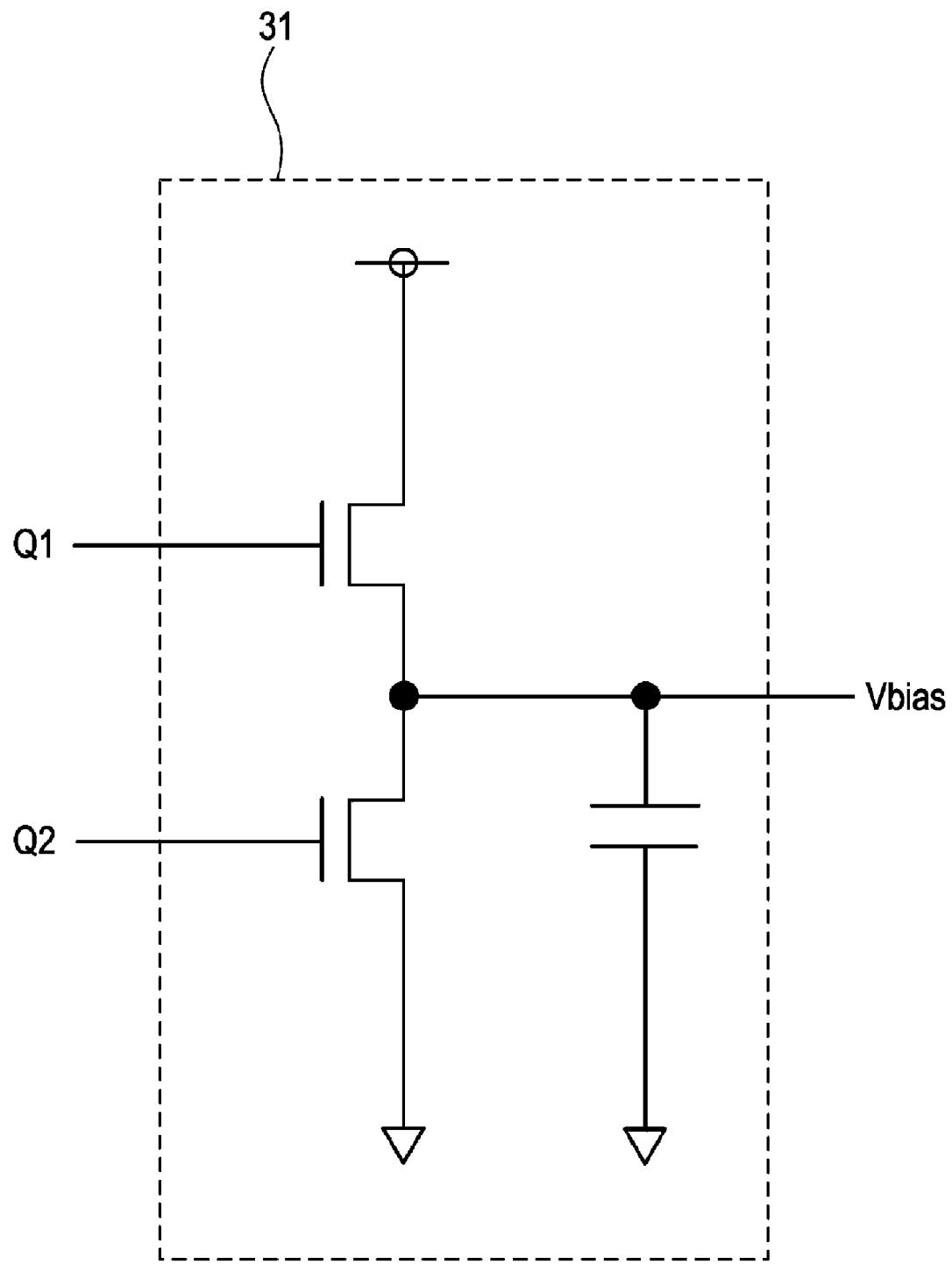
FIG. 7 shows an example of the configuration of a charge pump.

The charge pump 31 is a circuit section configured to generate a bias voltage Vbias (analog voltage) of the voltage-controlled delay line 23 in accordance with the output signals Q1 and Q2 of the phase comparison circuit section 29. FIG. 7 shows an example of the circuit configuration of the charge pump 31.

With the circuit configuration shown in FIG. 7, in the case that the output signal Q1 exhibits ON and the output signal Q2 exhibits OFF, a load capacitance is charged. Thus, the bias voltage Vbias increases. On the other hand, in the case that the output signal Q1 exhibits OFF and the output signal Q2 exhibits ON, the load capacitance is discharged. Thus, the bias voltage Vbias decreases. In the case that both the output signals Q1 and Q2 exhibit OFF, the load capacitance is maintained.

Figure 8A:
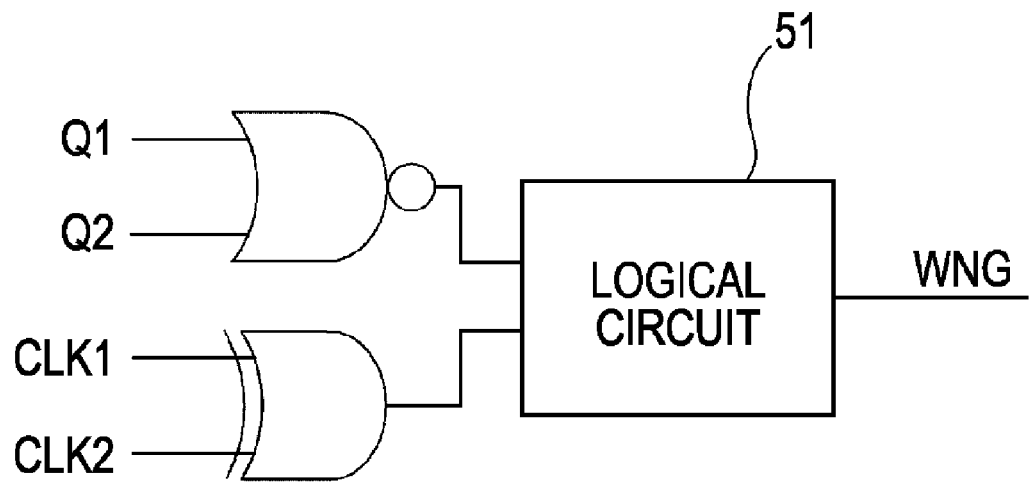
FIGS. 8A and 8B show examples of the configuration of a pseudo-lock detection section.
Figure 8B:
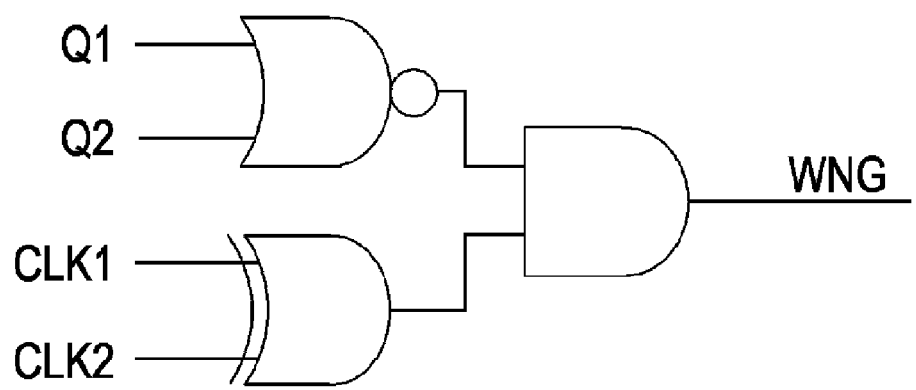

The pseudo-lock detection section 33 is a circuit section configured to detect a pseudo-locked state of the input clock CLK1 and the output clock CLK2. FIGS. 8A and 8B show examples of the circuit configuration of the pseudo-lock detection section 33. FIG. 8A shows an example of the circuit configuration of the pseudo-lock detection section 33 in which gate circuits and a logical circuit 51 are combined with each other. FIG. 8B shows an example of the configuration of the pseudo-lock detection section 33 in which only gate circuits are combined together.

FIG. 9 shows the relationship between inputs and outputs of the pseudo-lock detection section 33. As shown in FIG. 9, in a case where both the output signals Q1 and Q2 exhibit level L and the signal level of the input clock CLK1 is different from the signal level of the output clock CLK2, the pseudo-lock detection section 33 determines that the input clock CLK1 and the output clock CLK2 are in the pseudo-locked state. In FIG. 9, cases where the input clock CLK1 and the output clock CLK2 are in the pseudo-locked state are surrounded by black frames.

The detection of whether the output signals Q1 and Q2 exhibit level L can be performed by a NOR gate shown in FIG. 8A or 8B. In addition, the detection of whether the signal level of the input clock CLK1 is different from the signal level of the output clock CLK2 can be performed by an exclusive-OR gate shown in FIG. 8A or 8B. The logical circuit 51 carries out the same logical operation as that carried out by an AND gate.

In the case that the pseudo-locked state is detected, the pseudo-lock detection section 33 sets a pseudo-lock detection signal WNG to level H. On the other hand, in the case that the pseudo-locked state is not detected, the pseudo-lock detection section 33 outputs a pseudo-lock detection signal WNG at level L.

Figure 10:
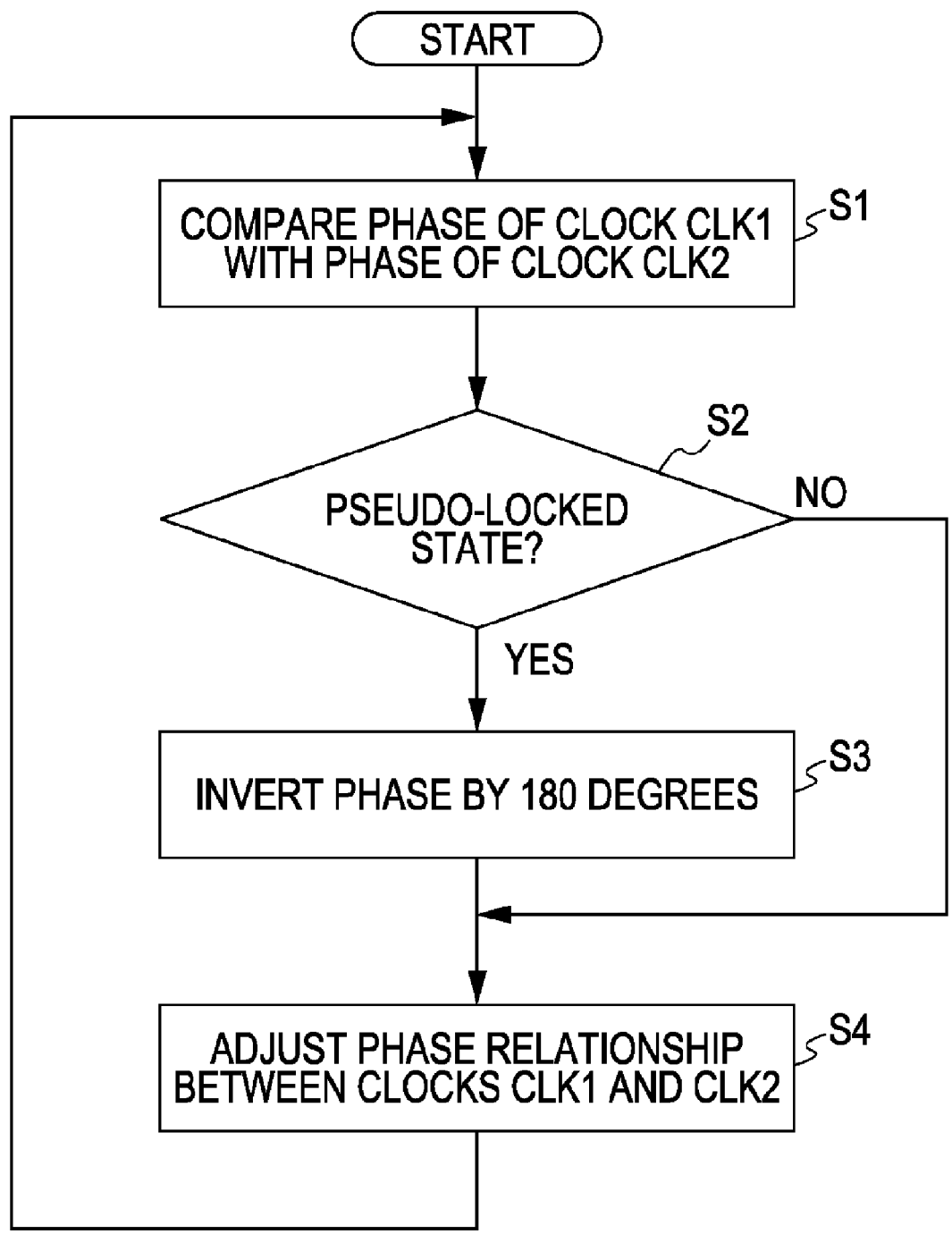
FIG. 10 is a flowchart showing a process to be performed by the clock signal generation circuit.

FIG. 10 illustrates a process to be performed by the clock signal generation circuit 11. As shown in FIG. 10, the clock signal generation circuit 11 performs the process repeatedly.

The phase comparison circuit section 29 compares the phase of the input clock CLK1 with the phase of the output clock CLK2 (step S1).

The pseudo-lock detection section 33 determines, in accordance with the output signals Q1 and Q2 output from the phase comparison circuit section 29 and a result of the comparison between the phase of the input clock CLK1 and the phase of the output clock CLK2, whether the present phase state is the pseudo-locked state (step S2).

If the determination in step S2 is negative, the pseudo-lock detection section 33 sets the relationship between an input and an output of the phase inversion/non-inversion section 25 to non-inversion. As a result, the input clock CLK1 for which the amount of delay has been adjusted by the voltage-controlled delay line 23 is output as the output clock CLK2 from the buffer circuit section 27 (step S4).

If the determination in step S2 is affirmative, the pseudo-lock detection section 33 sets the relationship between an input and an output of the phase inversion/non-inversion section 25 to inversion (step S3). As a result, the input clock CLK1 for which the amount of delay has been adjusted by the voltage-controlled delay line 23 is inverted by 180 degrees by the phase inversion/non-inversion section 25 and output as the output clock CLK2 from the buffer circuit section 27 (step S4).

Since the phase difference between the input clock CLK1 and the output clock CLK2 is 180 degrees in the pseudo-locked state, by the inverting operation of the phase inversion/non-inversion section 25, the phase difference between the input clock CLK1 and the output clock CLK2 is adjusted to approximately 0 degree.

Thus, even in a case where the phases of the input clock CLK1 and the output clock CLK2 are falsely locked in the pseudo-locked state in accordance with a false determination performed by the phase comparison circuit section 29, the phase difference between the input clock CLK1 and the output clock CLK2 can be approximated to 0 degree in a short period of time.

In particular, in a case where the clock signal generation circuit 11 is formed, by using a thin-film process or a printing technique, on the glass substrate 3, which is an insulating substrate, since the carrier mobility of an active element is small, the probability of occurrence of a pseudo-locked state increases. However, with the provision of the function of detecting the pseudo-locked state and a function of inverting the phase of a clock, a locked state can be achieved only in a short period of time.

Second Embodiment

In a second embodiment, a case where the amount of delay in the clock signal generation circuit 11 formed in the display panel 1 shown in FIG. 2 is controlled in a digital fashion will be described. Thus, the configuration of the display panel according to this embodiment is the same as shown in FIG. 2 with the exception of a clock signal generation circuit.

Figure 11:
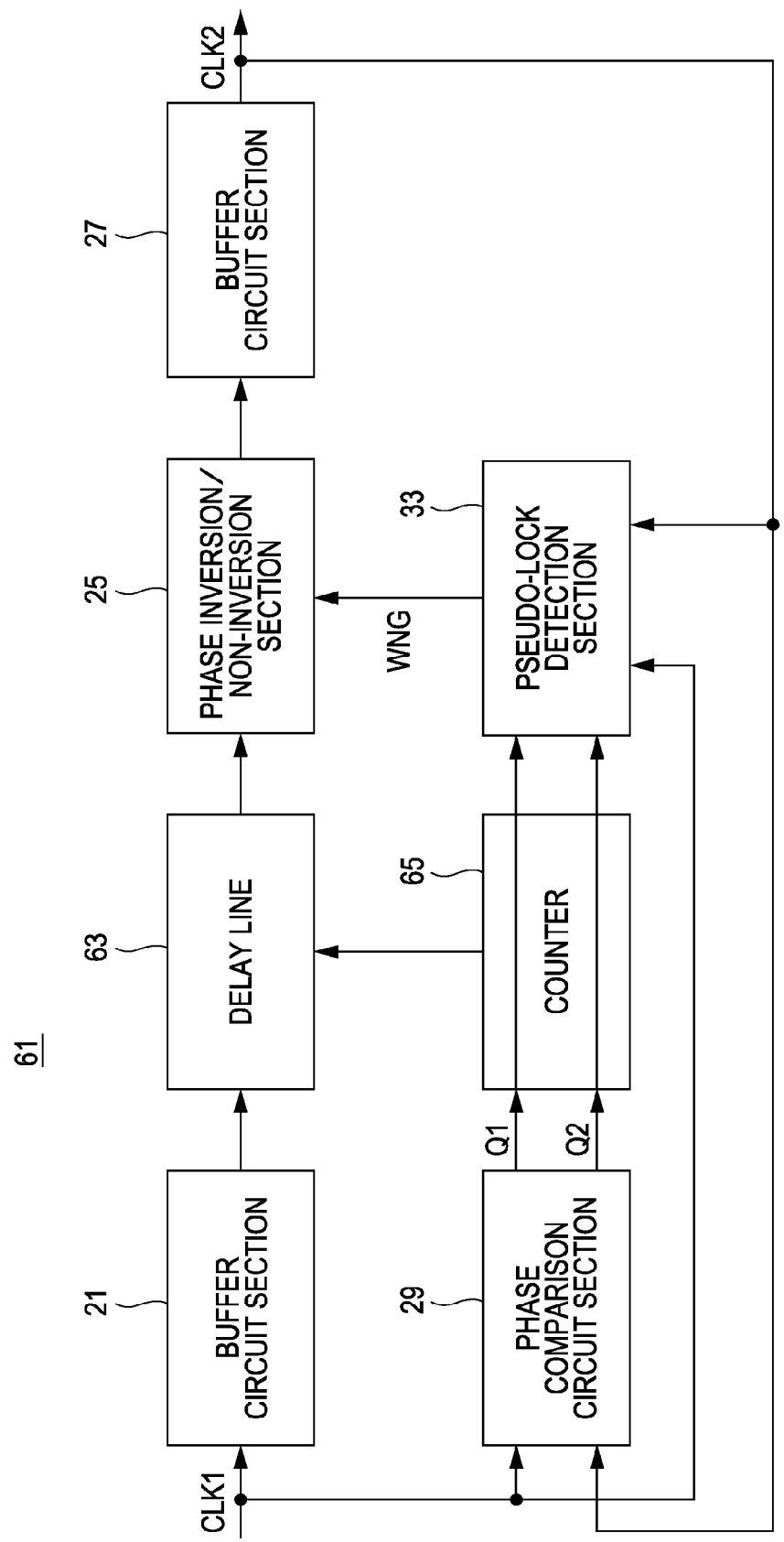
FIG. 11 shows an example of the configuration of a clock signal generation circuit.

FIG. 11 shows an example of the internal configuration of a clock signal generation circuit 61 according to an embodiment of the present invention. In FIG. 11, sections corresponding to those shown in FIG. 3 are denoted by the same reference numerals. The clock signal generation circuit 61 includes the buffer circuit section 21, a delay line 63, the phase inversion/non-inversion section 25, the buffer circuit section 27, the phase comparison circuit section 29, a counter 65, and the pseudo-lock detection section 33.

Figure 12:
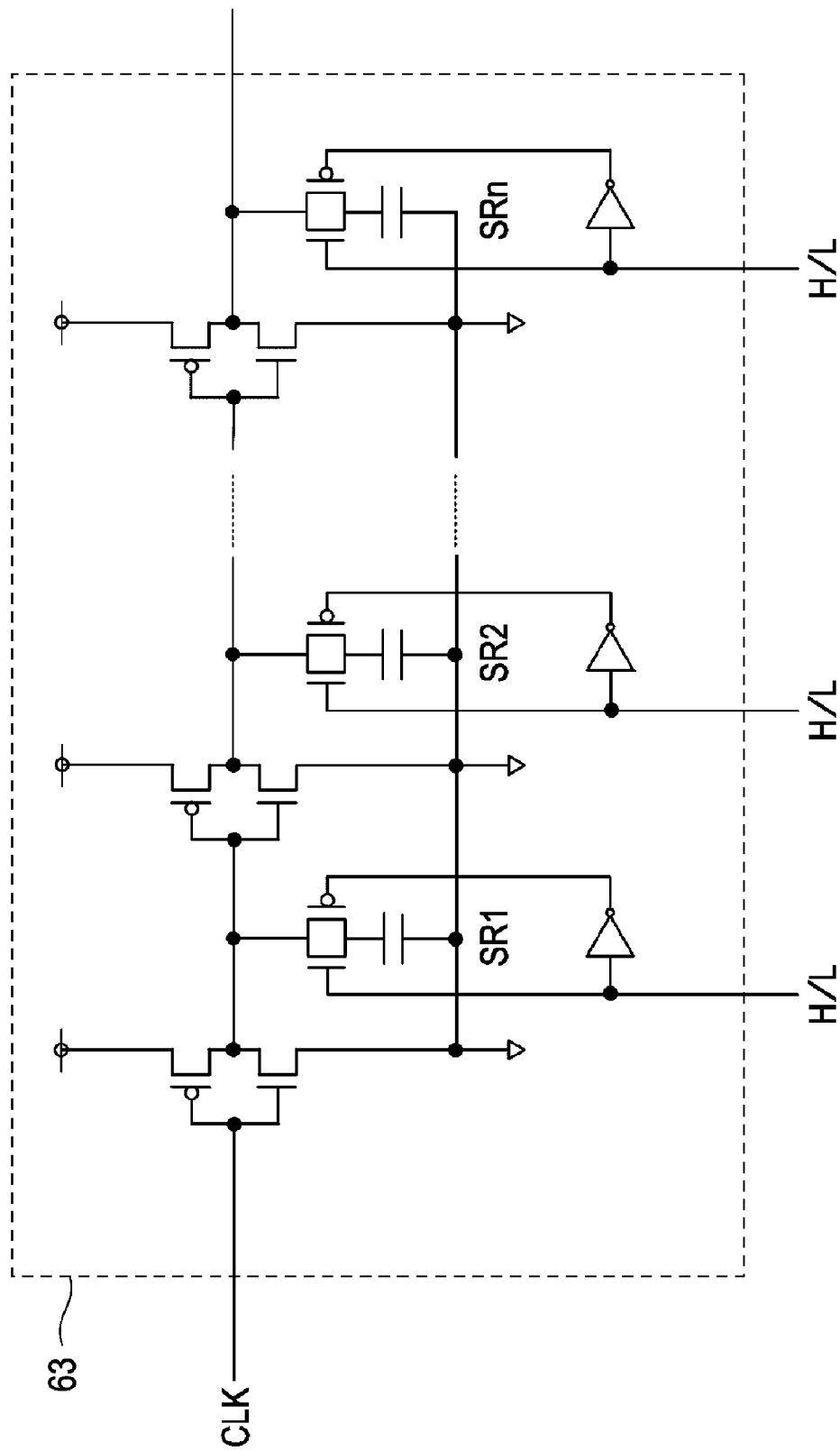
FIG. 12 shows an example of the configuration of a delay line.

The internal configuration of the clock signal generation circuit 61 shown in FIG. 11 is different from the clock signal generation circuit 11 shown in FIG. 3 in that the amount of delay in the delay line 63 is controlled in a digital fashion and in that the counter 65 is used for controlling the amount of delay. FIG. 12 shows an example of the circuit configuration of the delay line 63. The delay line 63 shown in FIG. 12 includes inverter circuits forming a propagation channel for the input clock CLK1. The inverter circuits are each provided with a load capacitor.

The configuration of the inverter circuits provided with load capacitors is the same as that of the inverter circuits provided with load capacitors in the voltage-controlled delay line 23 shown in FIG. 3. However, the driving method of the delay line 63 shown in FIG. 12 is different from the driving method of the voltage-controlled delay line 23 shown in FIG. 3 in that a pair of transistors connected between an output stage of an inverter circuit and a load capacitor serves as a switch and is turned on or turned off.

That is, in the case of the delay line 63, a driving method for increasing the amount of delay by increasing the number of load capacitors connected to output terminals for individual inverter circuits and for decreasing the amount of delay by decreasing the number of load capacitors connected to output terminals for individual inverter circuits is employed. In this respect, the delay line 63 is different from a delay line in an analog system for uniformly increasing or decreasing the delay time for all the inverter circuits.

The counter 65 is a circuit section including a binary counter unit and a decoder unit and configured to control the number of connected load capacitors constituting the delay line 63 in accordance with the value indicated by the counter 65. In this embodiment, the binary counter unit counts up by a value corresponding to the phase difference between the input clock CLK1 and the output clock CLK2.

Figure 13:
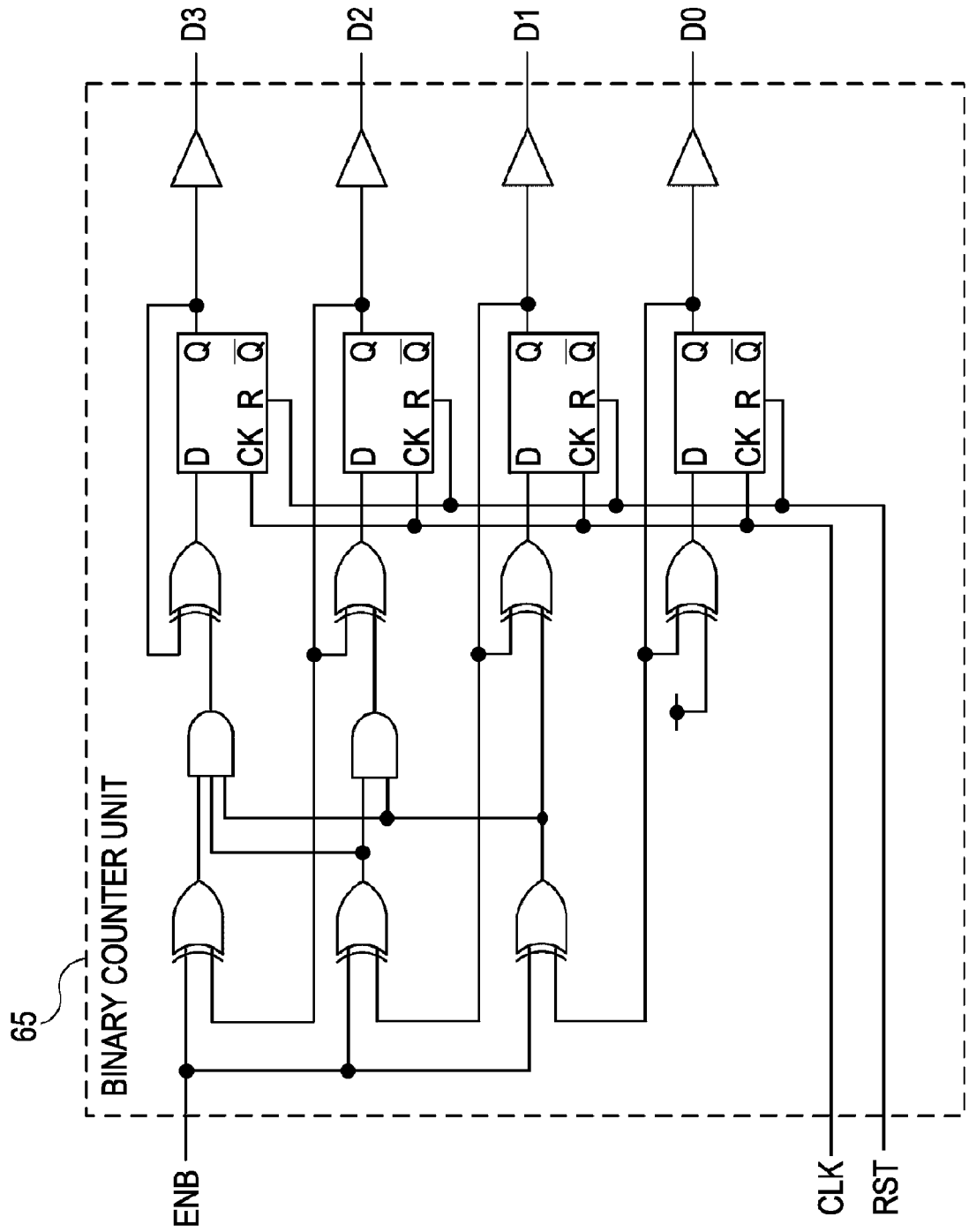
FIG. 13 shows an example of the configuration of a binary counter unit.
Figure 14:
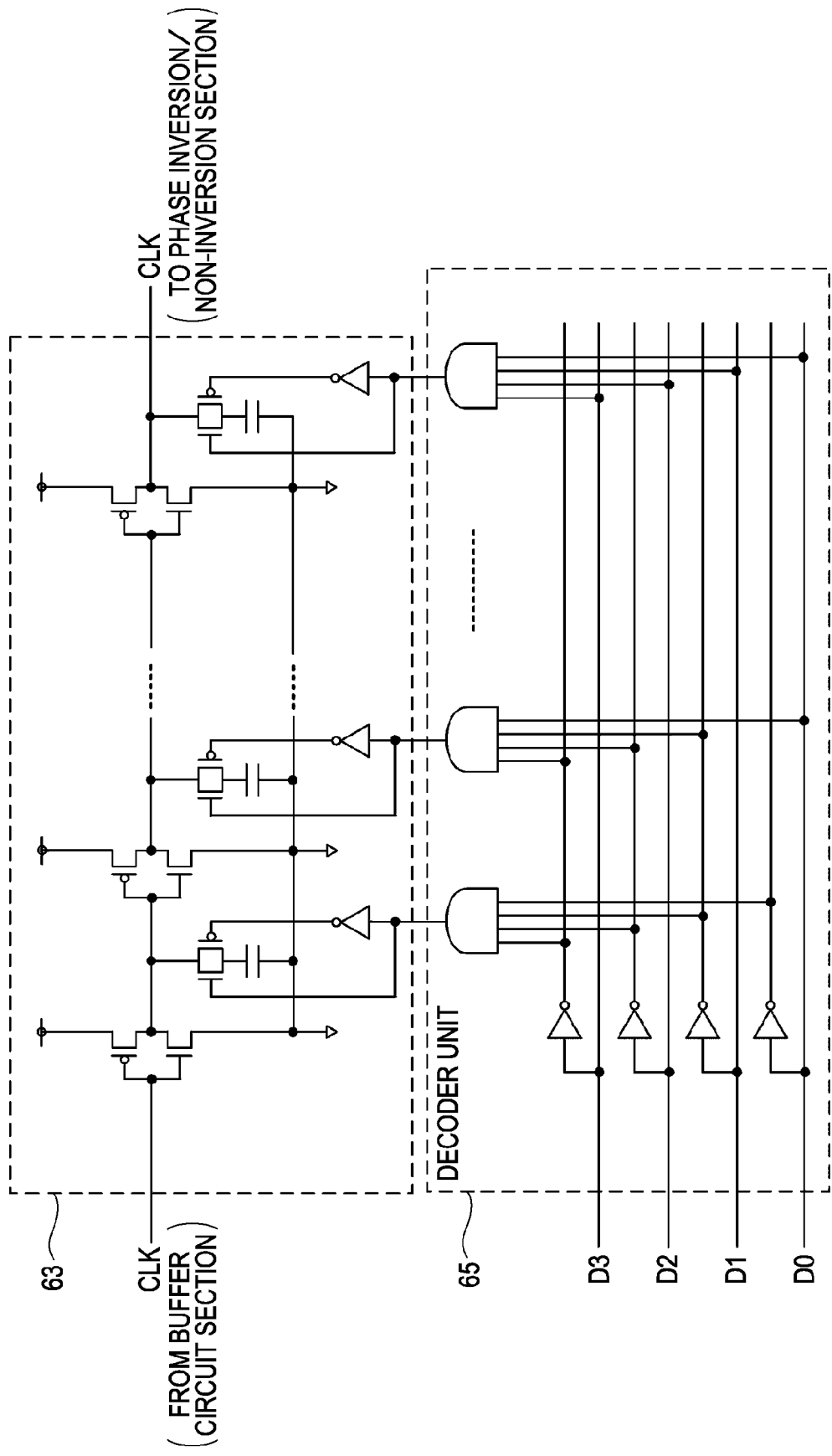
FIG. 14 shows an example of the configuration of a decoder unit.

FIG. 13 shows an example of the configuration of the binary counter unit of the counter 65. FIG. 14 shows an example of the configuration of the decoder unit of the counter 65. The count value of the binary counter unit indicates a phase difference. The decoder unit outputs an ON signal for turning on a pair of transistors for connecting an output terminal of an inverter circuit to a load capacitor in such a manner that a number of load capacitors corresponding to the count value are connected to output terminals of corresponding inverter circuits.

The decoder unit also outputs an OFF signal for turning off a pair of transistors for connecting an output terminal of an inverter circuit to a load capacitor in such a manner that corresponding load capacitors are not connected to output terminals of the other inverter circuits.

More specifically, as an ON signal, "level H" is set to the gate electrode of an N-channel transistor and "level L" is set to the gate electrode of a P-channel transistor. As an OFF signal, "level L" is set to the gate electrode of an N-channel transistor and "level H" is set to the gate electrode of a P-channel transistor.

Obviously, in this embodiment, in the case that a pseudo-locked state is detected, the clock phase in a delay transmission channel can be inverted by 180 degrees under the control of the pseudo-lock detection section 33. Consequently, in a case where the amount of delay in the delay line 63 is controlled in a digital fashion, the clock signal generation circuit 61 enabling a locked state to start in a short period of time can be achieved.

Other Embodiments

The clock signal generation circuit 11 and the clock signal generation circuit 61 each including the phase inversion/non-inversion section 25 have been described in the above-described embodiments. However, a different circuit configuration providing a function equivalent to that of the phase inversion/non-inversion section 25 can be achieved.

Figure 15:
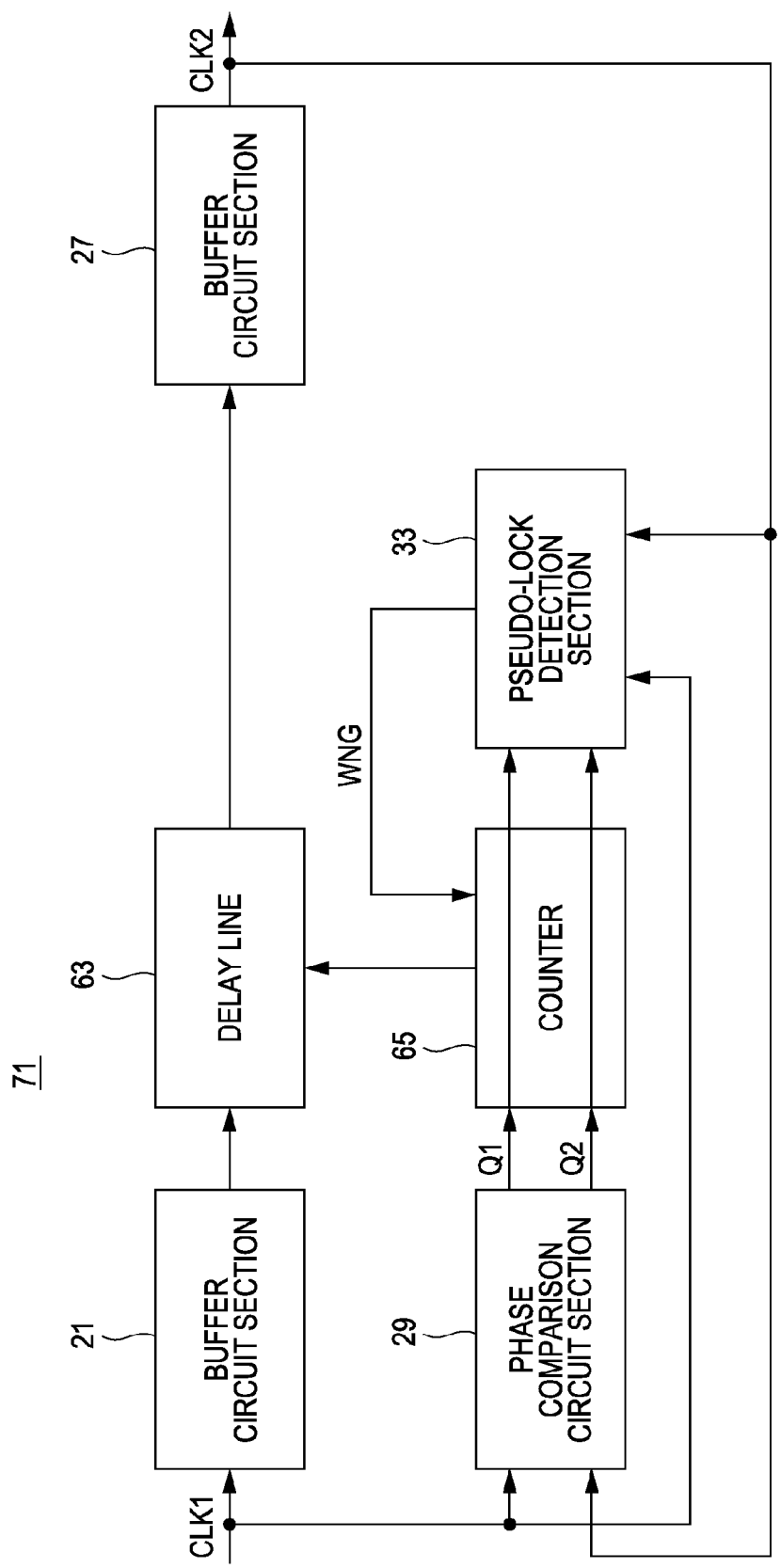
FIG. 15 shows an example of the configuration of a clock signal generation circuit.

For example, a clock signal generation circuit 71 shown in FIG. 15 provides a function equivalent to that of the phase inversion/non-inversion section 25. In FIG. 15, sections corresponding to those shown in FIG. 11 are referred to by the same reference numerals. That is, the clock signal generation circuit 71 is an example of a clock signal generation circuit in which a method for adjusting the amount of delay in a digital fashion is employed.

In the clock signal generation circuit 71 shown in FIG. 15, the function corresponding to the phase inversion/non-inversion section 25 is implemented by re-updating the count value of the counter 65. That is, the counter 65 to which detection of pseudo-lock has been reported adds a set count value corresponding to a phase difference of 180 degrees to the count value updated on the basis of the phase difference between the input clock CLK1 and the output clock CLK2.

Then, the counter 65 supplies ON signals or OFF signals to the delay line 63 in such a manner that a number of load capacitors corresponding to the re-updated count value are connected to corresponding inverter circuits. In a period during which pseudo-lock is not detected, as in the second embodiment, the counter 65 supplies ON signals or OFF signals to the delay line 63 in such a manner that a number of load capacitors corresponding to the count value updated on the basis of the phase difference between the input clock CLK1 and the output clock CLK2 are connected to corresponding inverter circuits.

With the configuration shown in FIG. 15, a function of re-adding a set count value corresponding to a phase difference of 180 degrees to the count value updated on the basis of the phase difference between the input clock CLK1 and the output clock CLK2 corresponds to a "pseudo-locked state release section" according to an embodiment of the present invention.

In the above-described embodiments, in the case that pseudo-lock is detected, a clock phase is inverted by 180 degrees. Thus, the pseudo-locked state can be converted into a locked state at one time.

However, as long as a phase relationship in a pseudo-locked state can be converted into a phase relationship in which a locked state can be achieved by a normal phase comparison operation, the amount of change in phase in a case where a pseudo-locked state is detected is not necessarily 180 degrees. For example, if a phase is changed by 90 or more degrees from the pseudo-locked state, the locked state can be achieved by a normal phase comparison operation.

In the above-described embodiments, active elements constituting a clock signal generation circuit are directly formed on a surface of a display panel, which is an insulating substrate, in accordance with a thin-film deposition technique using polysilicon (irrespective of high temperature or low temperature), amorphous silicon, or organic materials, or a printing technique.

However, the insulating substrate on which such a clock signal generation circuit is formed may be an insulating substrate mounted on the display panel.

The clock signal generation circuits described in the above-described embodiments may be formed not only on an organic electroluminescence (EL) panel, a plasma display, a field emission display, or any other light-emitting display panel but also on a liquid crystal panel or the same substrate as that of a display area.

The above-described clock signal generation circuits may be provided in an electronic apparatus other than a system display. An example of the electronic apparatus will be described.

Figure 16:
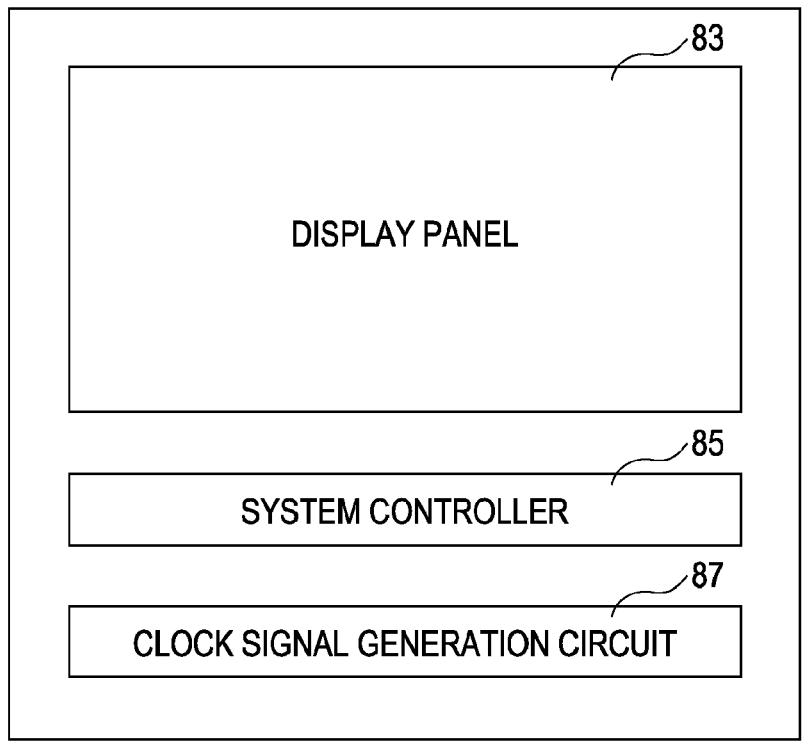
FIG. 16 shows an example of the system configuration of an electronic apparatus.

FIG. 16 shows an example of the system configuration of an electronic apparatus including a display panel. An electronic apparatus 81 includes a display panel 83, a system controller 85, and a clock signal generation circuit 87. The clock signal generation circuit 87 may be formed on a substrate of the display panel 83 or formed on a different substrate.

The system controller 85 is a processing unit including, for example, a central processing unit (CPU), and configured to control an operation of the entire system. The system controller 85 also includes an interface corresponding to the use of the electronic apparatus 81.

Figure 17:
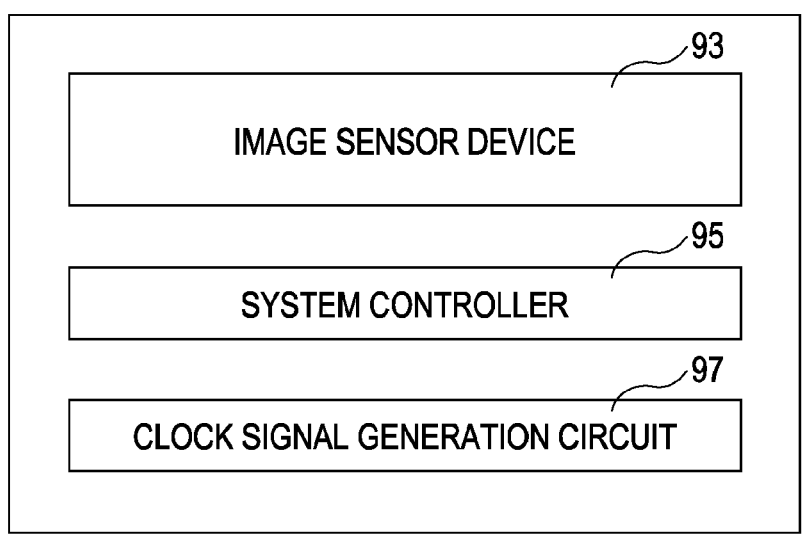
FIG. 17 shows an example of the system configuration of an electronic apparatus.

FIG. 17 shows an example of the system configuration of an electronic apparatus including an image sensor device (imager). An electronic apparatus 91 includes an image sensor device 93, a system controller 95, and a clock signal generation circuit 97.

The clock signal generation circuit 97 is a circuit configured to generate an operation clock of the image sensor device 93. As in the above-described embodiments, the clock signal generation circuit 97 may be formed on a substrate of the image sensor device 93 or formed on a different substrate.

The system controller 95 is a processing unit including, for example, a CPU, and configured to control an operation of the entire system. The system controller 95 also includes an interface corresponding to the use of the electronic apparatus 91. The image sensor device 93 may be a sensing device not including the system controller 95.

An example of the appearance of an electronic apparatus including any of the above-described clock signal generation circuits will be described. The clock signal generation circuit is contained in a certain portion within the casing of the electronic apparatus.

Figure 18:
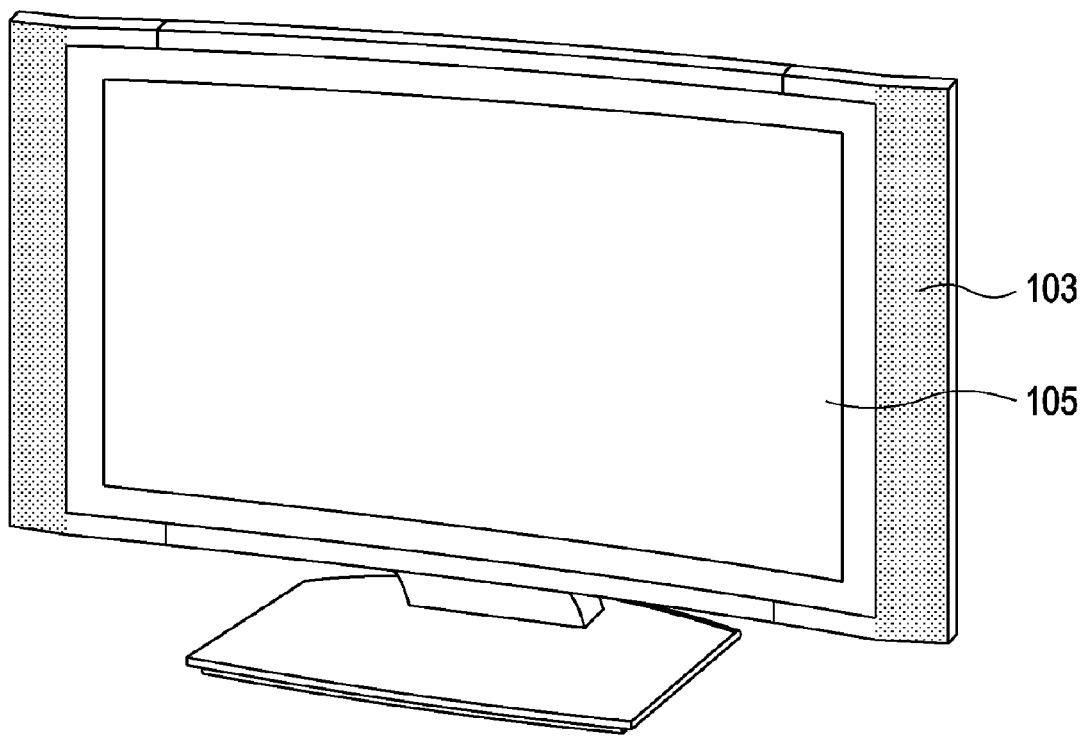
FIG. 18 shows an example of the appearance of an electronic apparatus.

FIG. 18 shows an example of the appearance of a television receiver 101. The television receiver 101 has a configuration in which a display panel 105 is provided in front of a front panel 103.

Figure 19A:
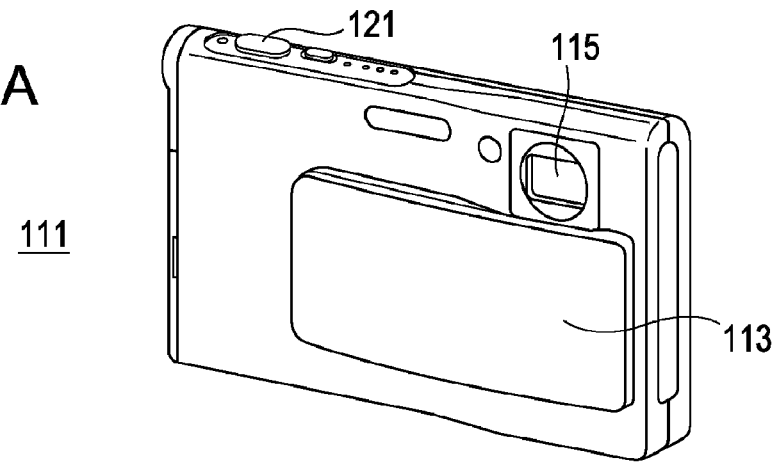
FIGS. 19A and 19B show an example of the appearance of an electronic apparatus.
Figure 19B:
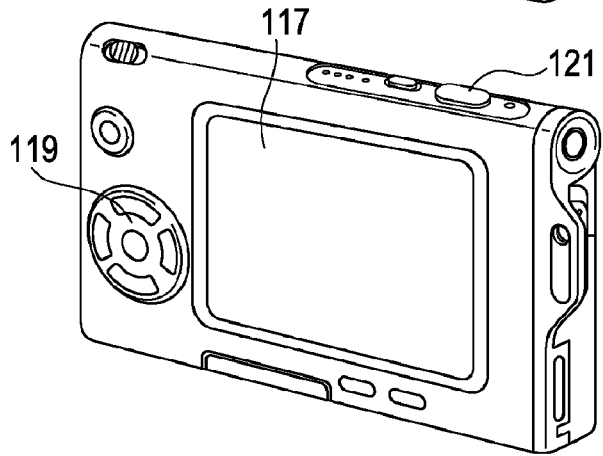

FIGS. 19A and 19B show an example of the appearance of a digital camera 111. FIG. 19A shows an example of the appearance of the digital camera 111 on a front side (object side). FIG. 19B shows an example of the appearance of the digital camera 111 on a rear side (photographer side).

The digital camera 111 has a configuration in which a protection cover 113, an image sensor lens 115, a display panel 117, a control switch 119, a shutter button 121, and other components are provided in the casing of the digital camera 111.

Figure 20:
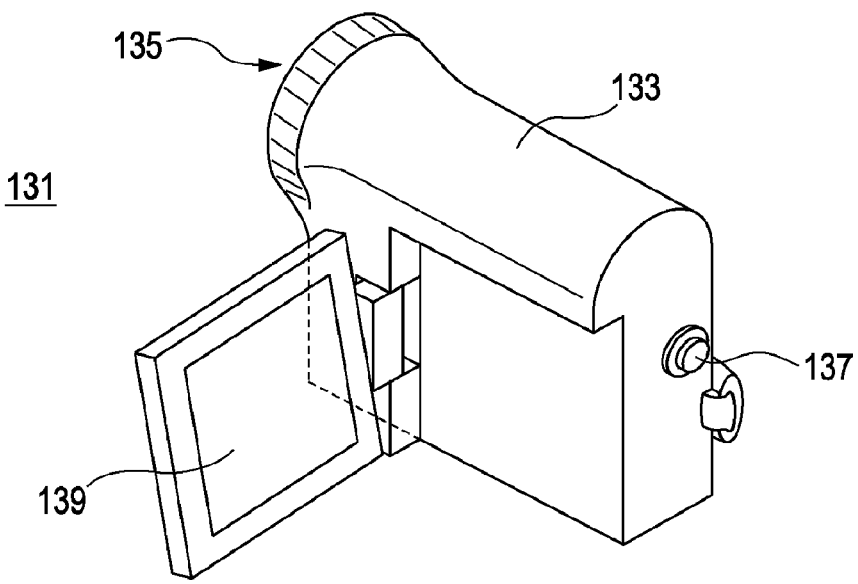
FIG. 20 shows an example of the appearance of an electronic apparatus.

FIG. 20 shows an example of the appearance of a video camera 131. The video camera 131 has a configuration in which an image sensor lens 135 for sensing an image of an object is provided in front of a main unit 133 of the video camera 131, a shooting start/stop switch 137 is provided at the back of the main unit 133, and a display panel 139 is provided on a side of the main unit 133.

Figure 21A:
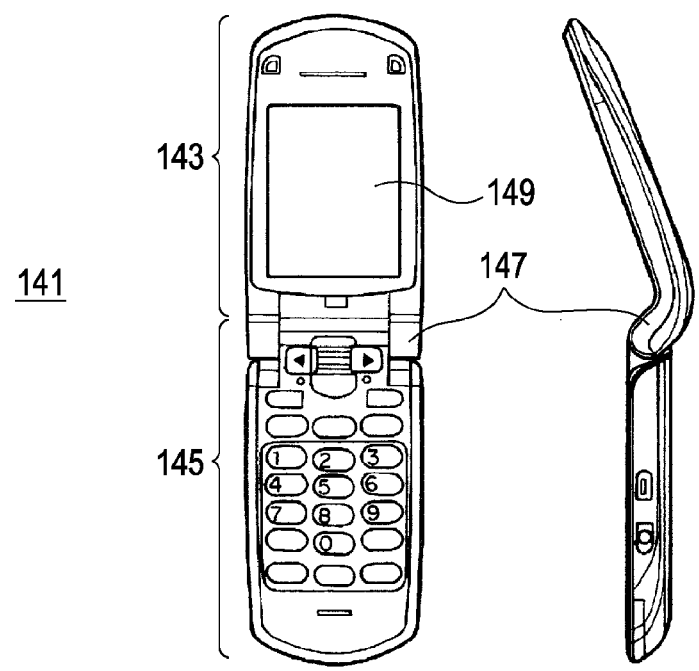
FIGS. 21A and 21B show an example of the appearance of an electronic apparatus.
Figure 21B:
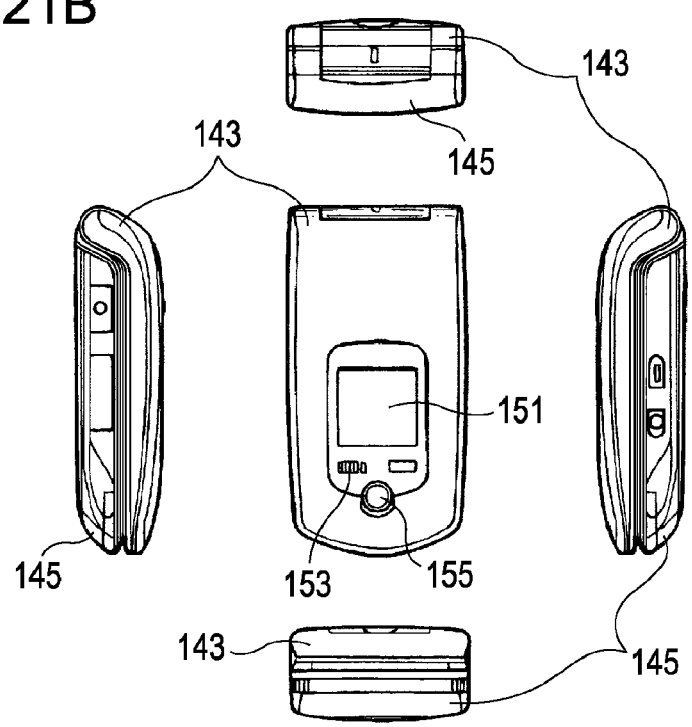

FIGS. 21A and 21B show an example of the appearance of a foldable cellular phone. FIG. 21A shows an example of the appearance of the cellular phone 141 in a state where the cellular phone 141 is unfolded. FIG. 21B shows an example of the appearance of the cellular phone 141 in a state where the cellular phone 141 is folded.

The cellular phone 141 includes an upper casing 143, a lower casing 145, a connection portion (in this example, a hinge portion) 147, a main display panel 149, an auxiliary display panel 151, a picture light unit 153, and an image sensor lens 155. The auxiliary display panel 151, the picture light unit 153, and the image sensor lens 155 are provided on a surface of the lower casing 145.

Figure 22:
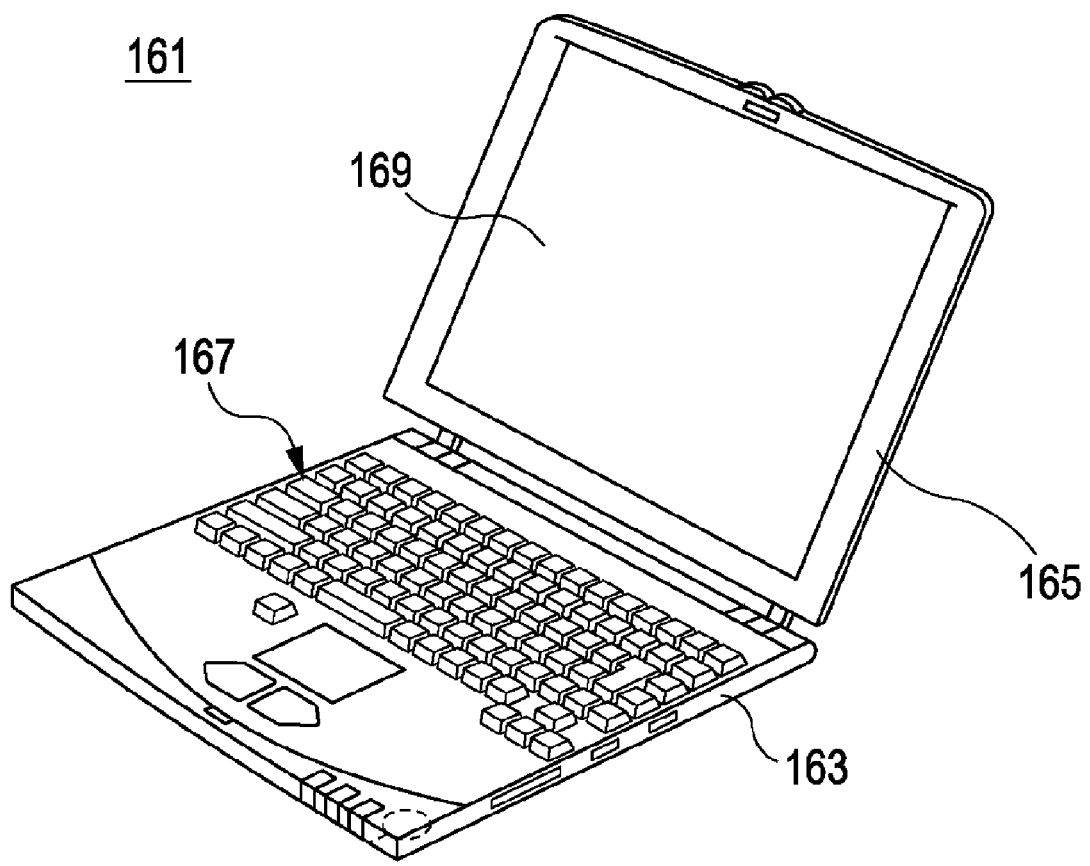
FIG. 22 shows an example of the appearance of an electronic apparatus.

FIG. 22 shows an example of the appearance of a computer. A computer 161 includes a lower casing 163, an upper casing 165, a keyboard 167, and a display panel 169.

In addition to the above-described configurations, a clock signal generation circuit may be provided in other types of electronic apparatuses, such as an audio playback apparatus, a game apparatus, an electronic book, and an electronic dictionary.

It should be understood by those skilled in the art that various modifications, combinations, sub-combinations and alterations may occur depending on design requirements and other factors insofar as they are within the scope of the appended claims or the equivalents thereof.

What is claimed is:

1. A clock signal generation circuit of a delay locked loop type comprising:
   a delay line configured to delay a first clock signal to generate a second clock signal;
   a delay amount controller configured to change the amount of delay in the delay line based on a phase difference between the first and second clock signals in such a manner that a phase of the second clock signal is in synchronization with a phase of the first clock signal;
   a pseudo-lock detection section configured to detect a pseudo-locked state of the first clock signal and the second clock signal based on the phase difference between the first and second clock signals;
   a phase comparison section configured to compare an edge phase of the first clock signal with an edge phase of the second clock signal so as to output the phase difference by way of one of an up signal and a down signal to the delay amount controller and the pseudo-lock detection section, the up signal representing a phase difference between the first and second clock signals when the phase of the first clock signal is advanced with respect to the phase of the second clock signal, the down signal representing a phase difference between the first and second clock signals when the phase of the second clock signal is advanced with respect to the phase of the first clock signal, the phase comparison section comprising:
(a) a first flip-flop having a clock terminal configured to receive the first clock signal;
(b) a second flip-flop having a clock terminal configured to receive the second clock signal; and
(c) a logical gate configured to perform a logical AND between outputs of the first and second flip-flops and generate reset signals for the first and second flip-flops at a same point in time;
wherein the up and down signals are each generated for a respective period representing the corresponding phase difference between the first and second clock signals;
and
a pseudo-locked state release section configured to change the amount of delay in the delay line in a case that the pseudo-locked state is detected.

2. The clock signal generation circuit according to claim 1, wherein in a case that the pseudo-locked state is detected, the pseudo-locked state release section inverts a clock phase in the delay line.

3. The clock signal generation circuit according to claim 1, wherein in a case that the pseudo-locked state is detected, the pseudo-locked state release section shifts a clock phase in the delay line by an amount corresponding to a set value.

4. The clock signal generation circuit according to any one of claims 1 to 3, wherein the delay line, the delay amount controller, the pseudo-lock detection section, and the pseudo-locked state release section are formed on an insulating substrate by using one of a thin-film deposition technique and a printing technique.

5. A display panel module comprising:
a display panel;
a clock signal generation circuit of a delay locked loop type including:
a delay line configured to delay a first clock signal to generate a second clock signal,
a delay amount controller configured to change the amount of delay in the delay line based on a phase difference between the first and second clock signals in such a manner that a phase of the second clock signal is in synchronization with a phase of the first clock signal,
a pseudo-lock detection section configured to detect a pseudo-locked state of the first clock signal and the second clock signal based on the phase difference between the first and second clock signals,
a phase comparison section configured to compare an edge phase of the first clock signal with an edge phase of the second clock signal so as to output the phase difference by way of one of an up signal and a down signal to the delay amount controller and the pseudo-lock detection section, the up signal representing a phase difference between the first and second clock signals when the phase of the first clock signal is advanced with respect to the phase of the second clock signal, the down signal representing a phase difference between the first and second clock signals when the phase of the second clock signal is advanced with respect to the phase of the first clock signal, the phase comparison section comprising:
(a) a first flip-flop having a clock terminal configured to receive the first clock signal;
(b) a second flip-flop having a clock terminal configured to receive the second clock signal; and
(c) a logical gate configured to perform a logical AND between outputs of the first and second flip-flops and generate reset signals for the first and second flip-flops at a same point in time
wherein the up and down signals are each generated for a respective period representing the corresponding phase difference between the first and second clock signals,
and
a pseudo-locked state release section configured to change the amount of delay in the delay line in a case that the pseudo-locked state is detected; and
a driving circuit configured to drive the display panel in accordance with the second clock signal.

6. The display panel module according to claim 5, wherein the display panel includes a liquid crystal panel.

7. An image sensor apparatus comprising:
an image sensor device;
a clock signal generation circuit of a delay locked loop type including:
a delay line configured to delay a first clock signal to generate a second clock signal,
a delay amount controller configured to change the amount of delay in the delay line based on a phase difference between the first and second clock signals in such a manner that a phase of the second clock signal is in synchronization with a phase of the first clock signal,
a pseudo-lock detection section configured to detect a pseudo-locked state of the first clock signal and the second clock signal based on the phase difference between the first and second clock signals,
a phase comparison section configured to compare an edge phase of the first clock signal with an edge phase of the second clock signal so as to output the phase difference by way of one of an up signal and a down signal to the delay amount controller and the pseudo-lock detection section, the up signal representing a phase difference between the first and second clock signals when the phase of the first clock signal is advanced with respect to the phase of the second clock signal, the down signal representing a phase difference between the first and second clock signals when the phase of the second clock signal is advanced with respect to the phase of the first clock signal, the phase comparison section comprising:
(a) a first flip-flop having a clock terminal configured to receive the first clock signal;
(b) a second flip-flop having a clock terminal configured to receive the second clock signal; and
(c) a logical gate configured to perform a logical AND between outputs of the first and second flip-flops and generate reset signals for the first and second flip-flops at a same point in time;
wherein the up and down signals are each generated for a respective period representing the corresponding phase difference between the first and second clock signals,
and
a pseudo-locked state release section configured to change the amount of delay in the delay line in a case that the pseudo-locked state is detected; and
a driving circuit configured to drive the image sensor device in accordance with the second clock signal.

8. An electronic apparatus comprising:
a clock signal generation circuit of a delay locked loop type including:
- a delay line configured to delay a first clock signal to generate a second clock signal,
- a delay amount controller configured to change the amount of delay in the delay line based on a phase difference between the first and second clock signals in such a manner that a phase of the second clock signal is in synchronization with a phase of the first clock signal,
- a pseudo-lock detection section configured to detect a pseudo-locked state of the first clock signal and the second clock signal based on the phase difference between the first and second clock signals,
- a phase comparison section configured to compare an edge phase of the first clock signal with an edge phase of the second clock signal so as to output the phase difference by way of one of an up signal and a down signal to the delay amount controller and the pseudo-lock detection section, the up signal representing a phase difference between the first and second clock signals when the phase of the first clock signal is advanced with respect to the phase of the second clock signal, the down signal representing a phase difference between the first and second clock signals when the phase of the second clock signal is advanced with respect to the phase of the first clock signal, the phase comparison section comprising:
    - (a) a first flip-flop having a clock terminal configured to receive the first clock signal;
    - (b) a second flip-flop having a clock terminal configured to receive the second clock signal; and
    - (c) a logical gate configured to perform a logical AND between outputs of the first and second flip-flops and generate reset signals for the first and second flip-flops at a same point in time;
        wherein the up and down signals are each generated for a respective period representing the corresponding phase difference between the first and second clock signals,
and
    a pseudo-locked state release section configured to change the amount of delay in the delay line in a case that the pseudo-locked state is detected;
a system controller configured to control an operation of an entire system; and
an instruction reception section configured to receive an instruction for the system controller.

* * * * *